United States Patent

[11] 3,610,948

[72] Inventor Sigurd G. Waaben
Princeton, N.J.
[21] Appl. No. 868,839
[22] Filed Oct. 23, 1969
[45] Patented Oct. 5, 1971
[73] Assignee Bell Telephone Laboratories, Incorporated
Murray Hill, N.J.

[54] CURRENT-SWITCHING DETECTOR
7 Claims, 3 Drawing Figs.

[52] U.S. Cl. .......... 307/202,
307/242, 307/254, 307/281, 307/319
[51] Int. Cl. .......... H02h 7/20
[50] Field of Search .......... 307/202,
281, 319, 242, 254

[56] References Cited

UNITED STATES PATENTS 3,086,163 4/1963 Francois .......... 307/202 X
3,105,920 10/1963 Dewey .......... 307/202 X
3,249,772 5/1966 Burns et al. .......... 307/281 X
3,527,966 9/1970 Forge .......... 307/281 X

*Primary Examiner*—John S. Heyman
*Attorneys*—R. J. Guenther and Kenneth B. Hamlin

ABSTRACT: A series of charge-storage diodes having different minority-carrier lifetimes are connected between power supply lines and are arranged so that a normally nonconducting signal branch is in parallel with the shortest minority-carrier-lifetime charge-storage diode. The charge-storage diodes and the signal branch respond to a short circuit condition across the power supply lines by switching reverse polarity minority-carrier current, conducted through the charge-storage diodes, from the short minority-carrier-lifetime diode to the signal branch. A signal then is developed in the signal branch for enabling a protection device to short circuit the power supply lines or for taking other desired action.

INVENTOR
S. G. WAABEN
BY Richard B. Havill
ATTORNEY

CURRENT-SWITCHING DETECTOR

BACKGROUND OF THE INVENTION

1. Field of the Invention

The invention is a detector circuit that is more particularly described as a current-switching detector using different minority-carrier lifetimes of charge-storage diodes to initiate current-switching.

2. Description of the Prior Art

Some monolithic integrated logic circuits require protection from destructive surges of line current that can occur as a result of inadvertent short circuits placed across a load of the logic circuit. A monolithic integrated circuit is a semiconductor circuit in which all components of the circuit are manufactured in a single tiny block of silicon, generally referred to as a die. Interconnections between circuit components within the die are made by metallization patterns affixed to the die so that individual components are inseparable from the complete circuit. One type of integrated logic circuit is an emitter-coupled transistor logic (ECTL) gate having level-shifting emitter-follower transistors in the outputs. The entire ECTL gate, including the emitter-follower transistors, can be constructed as a monolithic integrated circuit. A test probe applied to the output of one of the emitter-followers may be positioned so that it short circuits a load resistor of that emitter-follower. If such a short circuit is maintained for more than a very brief period while power is supplied to the circuit, the emitter-follower transistor will be burned out thus destroying the usefulness of the entire monolithic integrated circuit as well as the emitter-follower transistor.

Circuit protection devices are designed to prevent such destruction of integrated circuits. One type of such a circuit protection device is a crowbar circuit which is arranged to short circuit either the ECTL gate itself or to short circuit the power supply coupled to the ECTL gate. The protection device causes a short circuit in response to a signal indicating that the load resistor of the emitter-follower transistor is short circuited. Although the protection device is arranged to respond to a signal indicating such a short circuit, there is a problem of producing a signal which can rapidly enable the protection device in response to the short circuit condition without also causing the protection device to respond undesirably to minor fluctuations of load current in the course of normal ECTL gate operation.

SUMMARY OF THE INVENTION

Therefore it is an object of the invention to provide an improved detector circuit that produces a gating signal in response to a short circuit condition.

It is another object of the invention to provide a detector which operates a protection device in response to adverse operating conditions without operating the protection device in response to normal operating conditions.

These and other objects of the invention are realized in an illustrative embodiment thereof in which a series of diodes are arranged between power supply lines to switch current into a normally nonconducting signal branch that is connected in parallel with one diode of the series of diodes. Such current-switching occurs in response to an inadvertent short circuit condition within an associated logic circuit load. The switching of current into the signal branch produces a gating signal which enables a protection device to short circuit either the logic circuit or the power supply for protecting the logic circuit from a destructive surge of current caused by the short circuit in the logic circuit.

A feature of the invention is a circuit configuration including a plurality of diodes arranged in series aiding relationship and a signal branch connected in parallel with at least one of the diodes.

Another feature is the use of different minority-carrier-lifetime diodes in the series of diodes and arranging them so that at least one short minority-carrier-lifetime diode is connected in parallel with the signal branch.

Another feature is a fast response diode disposed in the signal branch and poled for forward conduction in the direction of reverse current conduction through the series of diodes.

A further feature is a circuit arranged for switching current from a reverse current path through a short minority-carrier-lifetime charge-storage diode into a forward-conducting path through a metal-semiconductor diode to produce a gating signal that DRAWINGS a circuit protection device.

A still further feature is a circuit responsive to a short circuit condition for producing a gating signal that disables a portion of the circuit causing the short circuit condition.

BRIEF DESCRIPTION OF THE DRAWINGS

A better understanding of the invention may be derived from the detailed description following if that description is considered with respect to the attached drawings in which.

DETAILED DESCRIPTION

Figure 1:
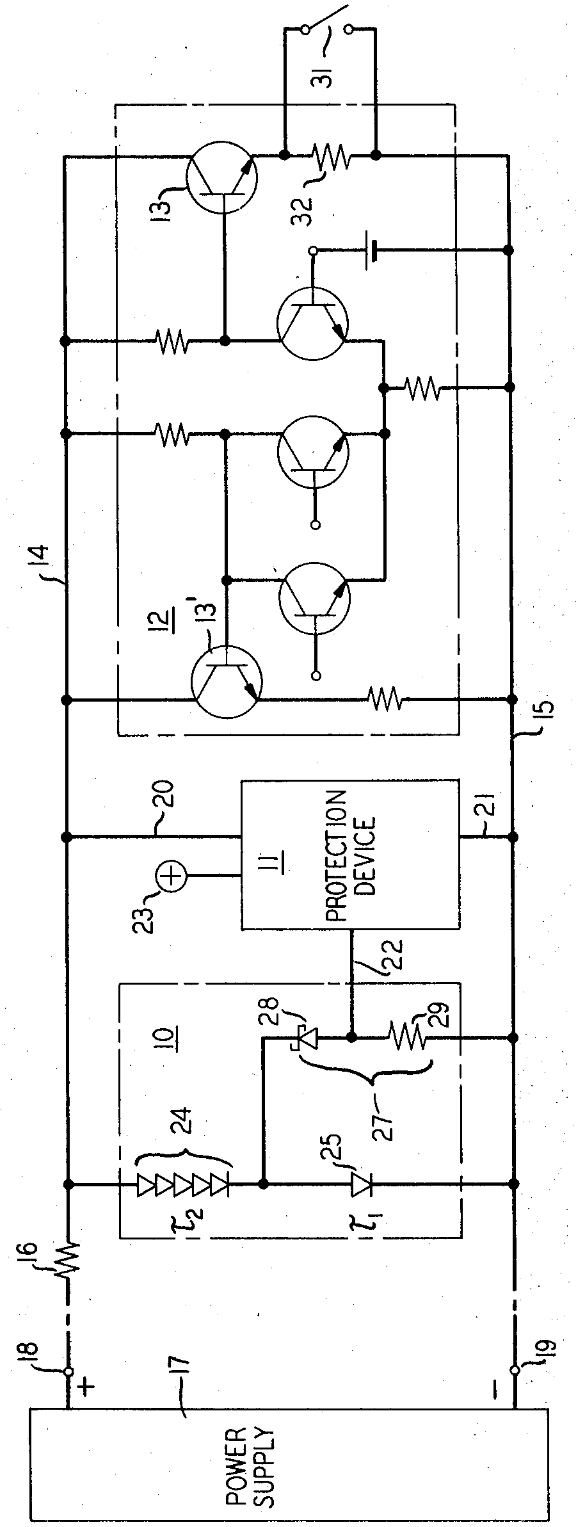
FIG. 1 shows a schematic diagram of power supply, a load, and a protection device connected with a detector circuit in accordance with the invention.

Referring now to FIG. 1, there is shown an illustrative embodiment of a detector circuit 10 that produces a gating signal for operating a protection device 11 in response to a short circuit condition in a logic circuit 12. As shown in the figure, the logic circuit 12 is an emitter-coupled transistor logic (ECTL) NOR gate having emitter-follower transistors 13 and 13' arranged as output stages. It is well known that this ECTL gate can be manufactured as a monolithic integrated circuit. The ECTL gate is interposed between leads 14 and 15 where it performs conventional current steering and imposes an impedance that makes only minor fluctuations in value during normal operation. The logic circuit 12 and a resistor 16 are connected in a series circuit arrangement between a pair of output terminals on a power supply 17 so that under normal load conditions current is conducted from a positive terminal 18 of the power supply 17 through the resistor 16, the lead 14, the logic circuit 12, and the lead 15 to a negative terminal 19 of the power supply 17.

The protection device 11 is shown illustratively in FIG. 1 as a block which represents any one of several well known circuit arrangements. One such circuit arrangement is called a crowbar circuit. The protection device 11 includes a pair of output leads 20 and 21 interposed between the power supply leads 14 and 15. During normal operation, the crowbar circuit presents an open circuit impedance between the leads 20 and 21 and therefore also between the leads 14 and 15. When enabled by a signal on a control lead 22, the protection device 11 conducts a relatively large magnitude of current from the lead 14 through the leads 20 and 21 to the lead 15. The protection device 11 is connected to a power supply terminal 23 which provides operating energy for the device 11.

Supply terminal 23 is shown symbolically as a circle enclosing a plus sign. This symbol represents a circuit arrangement in which a positive potential terminal of a power supply is connected to the indicated circuit node and in which the terminal of opposite polarity is connected to terminal 19.

Figure 2:
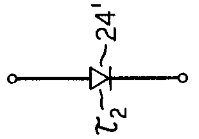
FIG. 2 shows an alternative arrangement of a portion of the detector circuit.

Detector circuit 10 is interposed between the power supply leads 14 and 15 in a parallel circuit arrangement with the logic circuit 12. The detector 10 is a circuit arrangement wherein a group of charge-storage diodes 24 are connected in series-aiding relationship with each other and with another charge-storage diode 25. The entire series of diodes 24 and 25 are connected between the leads 14 and 15 so that the diodes are poled for forward conduction in normal operation. During normal load operation, the diodes 24 and 25 establish a relatively fixed voltage drop between the leads 14 and 15 thereby regulating the voltage drop across the logic circuit 12. One charge-storage diode 24′, as shown in FIG. 2, located in the place of the several diodes 24, may be sufficient to operate the invention in some embodiments of the invention. However, the several diodes 24 are included in the illustrative embodiment of FIG. 1 to establish between the lines 14 and 15 a voltage drop used for operating the logic circuit 12.

The diodes 24 have a different minority-carrier-lifetime $\tau_2$ than the minority-carrier-lifetime $\tau_1$ of the diode 25. The minority-carrier lifetimes $\tau_1$ and $\tau_2$ are selected so that the diode 25 has a substantially shorter minority-carrier-lifetime $\tau_1$ than the minority-carrier-lifetime $\tau_2$ of each of the diodes 24. While the charge-storage diodes 24 and 25 are conducting in their forward conduction mode, minority carriers are stored therein. The quantity of minority carriers stored in the diodes 24 and 25 is proportional to their respective minority-carrier lifetimes $\tau_2$ and $\tau_1$ after the diodes have conducted in their forward conduction mode for a sufficiently long period of time.

In the detector circuit 10, a signal current branch 27 includes a metal-semiconductor diode, or Schottky barrier diode 28, and a resistor 29 connected in series circuit with each other. They couple the lead 15 to a junction between the diodes 24 and the diode 25. An additional junction between the diode 28 and the resistor 29 is connected to the control lead 22. The metal-semiconductor diode 28 is poled to conduct forward current from the lead 15 through the resistor 29, the diode 28, and the diodes 24 to the lead 14. This is the direction in which reverse current is conducted through the diodes 24.

In some embodiments of the invention, there may be two or more diodes substituted in place of the diode 25. The number of diodes inserted where diode 25 is shown in FIG. 1 depends upon the normal voltage drop desired at that junction.

During normal load conditions, a switch 31 is open and the protection device 11 is disabled. Current is conducted from the positive terminal 18 of the power supply 17 through the resistor 16, the lead 14, the branches of the logic circuit 12, and the lead 15 to the negative terminal 19 of the power supply 17. As previously mentioned, a portion of the current from the power supply is also conducted through the charge-storage diodes 24 and 25, which store minority carriers while they are thus conducting in their forward bias mode. Each of the diodes 24 stores more minority carriers than the diode 25 stores because the minority-carrier-lifetime $\tau_2$ of diodes 24 is greater than the minority-carrier-lifetime $\tau_1$ of the diode 25.

At the same time that the diodes 24 and 25 are conducting in their forward bias mode, the diode 28 is reversely biased and cut off. Thus, no current is conducted through the diode 28 and the resistor 29 while the diodes 24 and 25 are conducting in their forward bias mode.

The protection device 11 is disabled while the diodes 24 and 25 are conducting in their forward bias mode because there is no current through either the diode 28 or the resistor 29 and the resistor 29 couples the potential of the lead 21 to the lead 22 assuring that the device 11 is disabled. While the protection device 111 is thus disabled, it provides an open circuit impedance between the leads 14 and 15.

The switch 31, which is not a part of the logic circuit 12, is shown in the figure merely for the purpose of demonstrating the operation of the detector circuit 10 in response to an abnormal short circuit condition occurring across a load resistor 32 of the emitter-follower transistor 13. In actual practice, the switch 31 may represent an oscilloscope probe or a meter lead that is positioned in such a way that it causes a short circuit to occur across the load resistor 32. The short circuit across the load resistor 32 will cause both an effective short circuit between the lines 14 and 15 and a large surge of current through the transistor 13. If the short circuit persists long enough, the surge of current will cause the emitter-follower transistor 13 to burn out. In any configuration wherein the logic circuit 12 is a monolithic integrated circuit with several transistors all contained on one silicon die, the burnout of transistor 13 will ruin the usefulness of the entire logic circuit 12.

The detector circuit 10 and the protection device 11 are designed to prevent such burnout of the transistor 13. When a short circuit occurs across the resistor 32 as a result of closing the switch 31, the voltage drop between the lines 14 and 15 tends to decrease below normal operating voltage. Stored charge in the diodes 24 and 25 briefly maintains substantially all of the normal operating voltage between the leads 14 and 15, but forward conduction through the diodes 24 and 25 terminates. When forward conduction through the diodes 24 and 25 is terminated, stored minority carriers are discharged from the diodes 24 and 25 causing a reverse polarity current through the diodes 24 and 25. The stored carriers are discharged through a path including the lead 14, the collector-emitter path of the transistor 13, the switch 31, and the lead 15. While the reverse polarity current is conducted through the diodes 24 and 25, the diodes maintain substantially all of the normal operating voltage and exhibit a very low impedance. Because of the low impedance, the diodes 24 and 25 conduct substantially all of the minority-carrier discharge current directed from the lead 15 to the lead 14.

As the minority carriers are discharged from the diodes 24 and 25, they are fully discharged from the diode 25 sooner than they are fully discharged from the diodes 24. In accordance with known circuit theory where there are two different quantities of charge being discharged by the same current, the smaller quantity of charge is fully discharged before the larger quantity of charge is fully discharged. As previously stated, the diode 25 has a smaller quantity of stored charge than the diodes 24. Since the same minority-carrier discharge current is conducted through all of the diodes 24 and 25, stored charge in diode 25 is fully discharged at the end of a minority-carrier discharge time $t_1$ before the stored charge in the diodes 24 is fully discharged at the end of a minority-carrier discharge time $t_2$.

As soon as the minority carriers are discharged from the diode 25 at the end of the time $t_1$, the diode 25 establishes an open circuit impedance. The voltage drop across the diode 25 increases and forward biases the diode 28 into conduction. A signal current is thus established through the diode 28 and the resistor 29. This signal current is conducted through both the diode 28 and the resistor 29 until the subsequent expiration of the minority-carrier discharge time $t_2$ when the minority carriers are fully discharged from the diode 24. The signal current in the branch 27 establishes across the resistor 29 a negative-going voltage drop which is sufficient in magnitude and duration to enable the protection device 11 to produce a short circuit impedance between the leads 20 and 21 and therefore also between the leads 14 and 15. This short circuit, between the leads 14 and 15 by way of the protection device 11, provides a low impedance path for reducing the short circuit current surge conducted through the emitter-follower transistor 13. Proper selection of the minority-carrier discharge times $t_2$ and $t_1$, respectively, of the diodes 24 and 25 will assure that the short circuit through the protection device 11 is established before the emitter-follower transistor 13 is burned out from excessive current.

Upon the expiration of the minority-carrier discharge time $t_2$ of the diodes 24, the diode 28 is cut off, and the protection device 11 is once again disabled. The metal-semiconductor diode 28 stores effectively no minority carriers as a result of its forward conduction and therefore recovers rapidly to cutoff because it has substantially no storage time for delaying its turnoff.

In some variations of the protection device 11, a self-latching feature can be included therein so that the protection device 11 remains enabled after the diode 28 recovers to cutoff.

The foregoing description has explained how the detector circuit 10 produces control signals in response to an abnormal short circuit condition in the logic circuit 12.

During normal operation, minor fluctuations of the impedance of the logic circuit 12 between the leads 14 and 15 may cause minor fluctuations of load current. Such minor fluctuations of load current will not cause the detector circuit 10 to enable the protection device 11 because the protection device 11 is not enabled until after the diodes 24 and 25 have conducted reverse current long enough to fully discharge the minority-carrier charge stored in diode 25 during forward conduction.

Although the protection device 11 is shown connected in parallel with the logic circuit 12, the protection device 11 may also be arranged so that the leads 20 and 21 are connected between the terminals 18 and 19 of the power supply 17 to produce a short circuit between the power supply terminals 18 and 19 in response to any short circuit condition caused by the switch 31.

Figure 3:
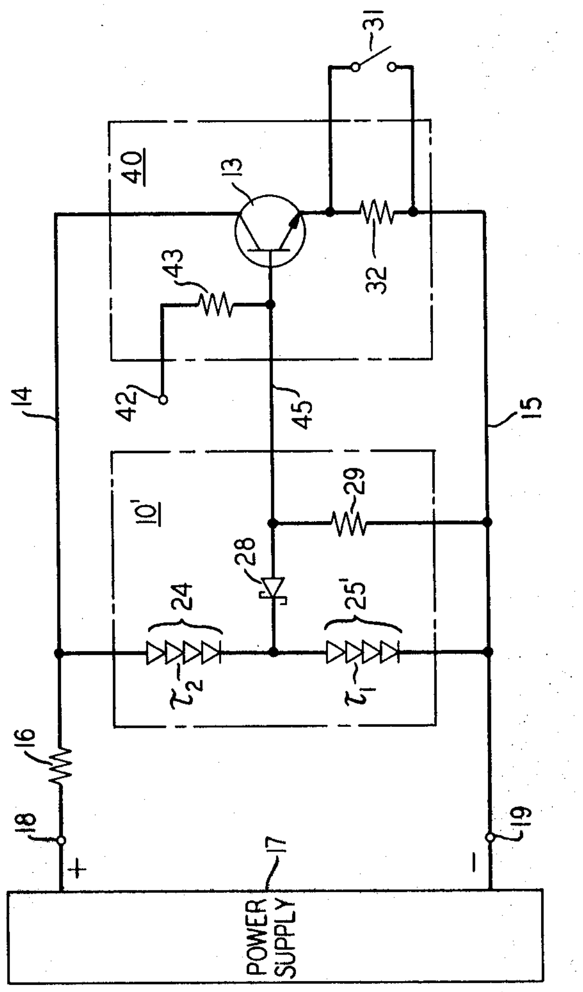
FIG. 3 shows a schematic diagram of an alternative embodiment of the invention.

Referring now to FIG. 3, there is shown an alternative detector circuit 10′ that produces a gating signal for directly disabling an emitter-follower circuit 40 in response to a short circuit condition across a load resistor 32 of that circuit.

In FIG. 3, the detector circuit 10′ is the same as circuit 10, shown in FIG. 1, except that a group of diodes 25′, in series-aiding circuit relationship, are substituted in place of the single diode 25 of FIG. 1. The diodes 25′ each have a minority-carrier-lifetime $\tau_1$ and a minority-carrier discharge time $t_1$. The series of diodes 25′ is interposed to establish sufficient quiescent potential for operating the emitter-follower circuit 40 under normal circuit conditions.

In FIG. 3, the emitter-follower circuit 40 replaces the logic circuit 12 of FIG. 1. Some elements of circuit 40 in FIG. 3 correspond with elements of circuit 12 of FIG. 1. Such corresponding elements are given the same designators in both figures. Input signals, normally operating the emitter-follower circuit 40 of FIG. 3, are applied by way of an input terminal 42 and a resistor 43 to the base electrode of the transistor 13.

The protection device 11 of FIG. 1 has been replaced in FIG. 3 by a lead 45 directly connecting the junction between the diode 28 and the resistor 29 of the detector circuit 10′ to the base electrode of the transistor 13.

During normal operation, the detector circuit 10′ of FIG. 3 operates similar to the detector circuit 10 of FIG. 1, however, operation in response to a short circuit condition is different. When a short circuit occurs in the circuit of FIG. 3 across the resistor 32 by closing the switch 31, the detector circuit 10′ produces on lead 45 a negative-going gating signal that is similar to the gating signal produced by the detector circuit 10 of FIG. 1. However, this negative-going signal is coupled directly to the base electrode of the transistor 13 in FIG. 3. The negative polarity signal is sufficient to cut off conduction through the transistor 13. Such cutoff occurs soon enough after the switch 31 is closed so that the surge of short circuit current through the transistor 13 is cut off before the transistor 13 burns out. Thus the emitter-follower circuit 40 is protected from destruction by direct response to a signal from the detector circuit 10′ rather than by indirect response through an additional protection device 11, as shown in FIG. 1.

The above detailed description is illustrative of two embodiments of the invention, and it is to be understood that additional embodiments thereof will be obvious to those skilled in the art. The embodiments described herein, together with those additional embodiments are considered to be within the scope of the invention.

What is claimed is:

1. A circuit comprising
first and second diodes having different minority-carrier lifetimes and arranged in series-aiding circuit relationship for conducting minority-carrier current in response to turnoff of forward conduction, the first diode terminates minority-carrier current before the second diode terminates such current,
signal branch means connected in parallel with the first diode conducting minority carriers of the second diode after termination of minority-carrier current in the first diode,
means supplying power to opposite end terminals of the first and second diodes,
a protection device having a normally open circuit path connected between the opposite end terminals of the first and second diodes, and
means connecting the signal branch means to a control lead of the protection device for enabling a low-impedance conduction path through the protection device in parallel with the first and second diodes.

2. A circuit in accordance with claim 1 wherein
the first and second diodes are charge-storage diodes, and
the signal branch means comprises a resistor and a fast response diode in series circuit, the fast response diode being poled for forward current conduction in the direction of reverse current conduction through the second diode.

3. A circuit comprising
first and second diodes having different minority-carrier lifetimes and arranged in series-aiding circuit relationship for conducting minority-carrier current in response to turnoff of forward conduction, the first diode terminates minority-carrier current before the second diode terminates such current,
signal branch means connected in parallel with the first diode conducting minority carriers of the second diode after termination of minority-carrier current in the first diode,
an emitter-follower circuit having first and second output leads connected between opposite end terminals of the first and second diodes, and
means connecting the signal branch means to a control lead of the emitter-follower for disabling the emitter-follower in response to termination of minority-carrier current in the first diode.

4. A circuit comprising
means supplying power between a pair of terminals,
a plurality of charge-storage diodes connected in a series-aiding circuit between the terminals, a first one of the charge-storage diodes having a shorter minority-carrier-lifetime than all of the other charge-storage diodes,
a protection device having a normally open circuit path connected in parallel with the plurality of charge-storage diodes,
signal branch means connected in parallel with at least the first charge-storage diode,
the signal branch means including a resistor and a metal-semiconductor diode in series circuit, the metal-semiconductor diode being poled for forward current conduction in the direction of reverse current conduction through the plurality of charge-storage diodes, and
means connecting a junction between the metal-semiconductor diode and the resistor to a control electrode of the protection device for enabling the protection device to produce a low impedance in parallel with the plurality of charge-storage diodes.

5. A circuit comprising
first and second circuit branches, the first branch including at least one diode and the second branch including at least one other diode, the first and second branches being connected in series-aiding circuit relationship for conducting minority-carrier discharge current in response to turnoff of forward conduction through the first and second branches, the first branch terminates minority-carrier discharge current before the second branch terminates minority-carrier discharge current,
signal branch means connected in parallel with the first branch conducts minority-carrier discharge current of the second branch after termination of minority-carrier discharge current in the first branch,
a protection device having a normally open circuit path connected between the opposite end terminals of the first and second branches, and
means connecting the signal branch means to a control lead of the protection device for enabling a low-impedance path through the protection device in parallel with the first and second diodes.

6. A circuit comprising first and second circuit branches, the first branch including at least one diode and the second branch including at least one other diode, the first and second branches being connected in series aiding circuit relationship for conducting minority-carrier discharge current in response to turnoff of forward conduction through the first and second branches, the first branch terminates minority-carrier discharge current before the second branch terminates minority-carrier discharge current, signal branch means connected in parallel with the first branch conducts minority-carrier discharge current of the second branch after termination of minority-carrier discharge current in the first branch, an emitter-follower circuit having first and second output leads connected between opposite end terminals of the first and second diodes, and means connecting the signal branch means to a control lead of the emitter-follower for disabling the emitter-follower in response to termination of minority-carrier current in the first branch.

7. A circuit comprising means for supplying power between a pair of terminals, a plurality of charge-storage diodes connected in a series-aiding circuit between the terminals, a first one of the charge-storage diodes having a shorter minority-carrier lifetime than all of the other charge-storage diodes, a load circuit having a normally conducting path connected in parallel with the plurality of charge-storage diodes, signal branch means connected in parallel with at least the first charge-storage diode, the signal branch means including a resistor and a metal-semiconductor diode in series circuit, the metal-semiconductor diode being poled for forward current conduction in the direction of reverse current conduction through the plurality of charge-storage diodes, and means responsive to forward current conduction in the signal branch for disabling conduction through the load circuit.